(12) United States Patent
Poliakov et al.

(10) Patent No.: US 10,847,245 B2
(45) Date of Patent: Nov. 24, 2020

(54) FAILURE INDICATOR PREDICTOR (FIP)

(71) Applicant: Intel Corporation, Santa Clara, CA (US)

(72) Inventors: Pavel Poliakov, Cameron Park, CA (US); Andrey Kudryavtsev, Mather, CA (US); Shekoufeh Qawami, El Dorado Hills, CA (US); Amirali Khatib Zadeh, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 90 days.

(21) Appl. No.: 16/112,574

(22) Filed: Aug. 24, 2018

(65) Prior Publication Data

US 2019/0043602 A1    Feb. 7, 2019

(51) Int. Cl.
*G11C 29/38*    (2006.01)
*G11C 29/44*    (2006.01)

(52) U.S. Cl.
CPC .............. *G11C 29/38* (2013.01); *G11C 29/44* (2013.01)

(58) Field of Classification Search
CPC ................................. G11C 29/38; G11C 29/44
See application file for complete search history.

(56) References Cited

U.S. PATENT DOCUMENTS

| 7,778,077 B2* | 8/2010 | Gorobets | G11C 8/10 |
| | | | 365/185.09 |
| 2003/0074611 A1 | 4/2003 | Nachumovsky | |
| 2006/0245248 A1* | 11/2006 | Hu | G11C 16/349 |
| | | | 365/185.09 |
| 2014/0181363 A1 | 6/2014 | Hoang et al. | |
| 2015/0371132 A1 | 12/2015 | Gemello et al. | |
| 2019/0278498 A1* | 9/2019 | Dedrick | G06F 3/0616 |

FOREIGN PATENT DOCUMENTS

EP    1321896 A2    6/2003

OTHER PUBLICATIONS

Non-Final Office Action dated May 20, 2020 for U.S. Appl. No. 16/281,559, 38 pages.

* cited by examiner

*Primary Examiner* — April Y Blair
*Assistant Examiner* — Rong Tang
(74) *Attorney, Agent, or Firm* — Schwabe, Williamson & Wyatt, P.C.

(57) ABSTRACT

A memory controller includes a memory to store results of a reference performance test (RT) performed on a non-volatile memory (NVM) die, where the results of the RT include one or more first indicators of failure associated with one or more first read/write cycles of the NVM die before the NVM die is placed in use. The memory controller further includes an analyzer coupled with the memory to perform, in one or more second read/write cycles, one or more field tests that provide second indicators of failure associated with one or more second read/write cycles of the NVM die during the use of the NVM die, and further to predict and dynamically adjust, over one or more second read/write cycles, at least one of likelihood or expected time of failure of the NVM, based at least in part on the first and second indicators of failure.

17 Claims, 10 Drawing Sheets

FAILURE INDICATOR PREDICTOR (FIP)

FIELD

Embodiments of the present disclosure relate to monitoring of non-volatile memory (NVM) devices, and in particular to performance testing of NVM dies to predict potential failure.

BACKGROUND

Various NVM technologies have been introduced to respond to increasing demand for performance and memory-storage capacity. Included amongst these technologies are, for example, 3D Xpoint™ and 3D NAND. These may provide high performance and high capacity Solid-State Drive (SDD) or memory solutions, such as, for example, dual in-line memory modules (DIMM). It is noted that state-of-the-art NVM technologies may involve a highly complex die structure as well as meticulous processing steps, and that these factors may increase the probability of die failures. Upon occurrence of such failures, operation of a SSD/DIMM may likely fail and migration to backup memory or storage, or rebuilding the image of the failed SSD, may then become unavoidable. When such failures happen unexpectedly and without advance notice, they may cause degradation in system performance or even disruption in delivering a desired or promised Quality of Service (QoS).

DETAILED DESCRIPTION

In embodiments described herein, a memory controller (MC) includes a memory to store results of a reference performance test (RT) that was performed on a non-volatile memory (NVM) die, where the results of the RT include one or more first indicators of failure that are associated with one or more first read and write cycles of the NVM die, and where the RT was performed before the NVM die was placed in use. The MC also includes an analyzer coupled with the memory, to perform, in one or more second read/write cycles, one or more field tests of the NVM die that provide second indicators of failure associated with the one or more second read/write cycles of the NVM die. The field tests are those performed once that the NVM die has been placed into use. The analyzer is also to predict and dynamically adjust, over the one or more second read/write cycles, either a likelihood or an expected time of failure of the NVM, or both, based at least in part on the first and second indicators of failure.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

As used herein, including in the claims, the term "chip" may refer to a physical integrated circuit (IC) on a computer. A chip in the context of this document may thus refer to an execution unit that can be single-core or multi-core technology.

As used herein, including in the claims, the term "processor" may refer to a logical execution unit on a physical chip. A multi-core chip may have several cores. As used herein the term "core" may refer to a logical execution unit containing an L1 (lowest level) cache and functional units. Cores are understood as being able to independently execute programs or threads.

In embodiments, a user, for example, an administrator of a data center, or an infrastructure manager, of a computer system that includes a NVM die in system memory may be informed as to the likelihood of failure of the NVM-die. Given that likelihood, in embodiments, the user may be further informed when a given SSD or DIMM comprising the NVM die may be likely to fail. In what follows, example solutions that provide such information according to various embodiments may be referred to as "Failure Indicator Predictors (FIPs)." FIPs report a condition of a NVM die in a given system, thereby allowing users to learn about its state, so as to be able to schedule preventative maintenance. The preventive maintenance may include, for example, migration to other memory media, or taking re-build time off prior to a fatal failure actually happening. In embodiments, a FIP may run an on-the-fly performance test. In embodiments, the FIP may be, for example, implemented in a controller ASIC provided in a memory module. In embodiments, for example, failure prediction enables data center customers to forecast their risks and start data or service migrations in advance of any failure. It is here noted that with growing SSD capacity, the time for migration or rebuild due to die failure significantly increases, which becomes especially critical for drives based on the quad-level cell (QLC) technology (16-level, 4 bit). Moreover, even if customers have access to the data, performance degradation may make the system unusable.

It is here noted that existing memory health diagnostics are based on a static notion of wearing out. They involve health status indicators based on media erase cycle counter information. It is noted though, that memory status information, which is based on elapsed cycles only, does not consider the actual state of the media. It assumes a medium wears out after a certain number of cycles, and once a defined threshold is reached reports the memory as unusable. Moreover, unlike various embodiments, prior solutions are not capable of any time-based predictions. Moreover, also in contrast to various embodiments, such solutions do not provide sufficient information for correlating media cycles with an actual risk for failure.

In contrast to exemplary embodiments, current techniques provide very limited QoS, and cannot be upgraded or improved to correlate NVM media wear out with SSD/DIMM workload. In general, in current SSD and DIMMs there is no storage of provisioned secured data, and thus SSD controllers do not execute any tests of media health. On the other hand, example embodiments may offer opportunities for in-situ media health checks, without performance degradation or buildup material increase.

In embodiments, users may benefit from receiving risk projections, such as possible failure within a day, week, month or any other time frame, which may be user defined. In embodiments, the frequency of field tests and corresponding generation of failure predictions may also depend on SSD type, e.g. client or enterprise.

Figure 1:
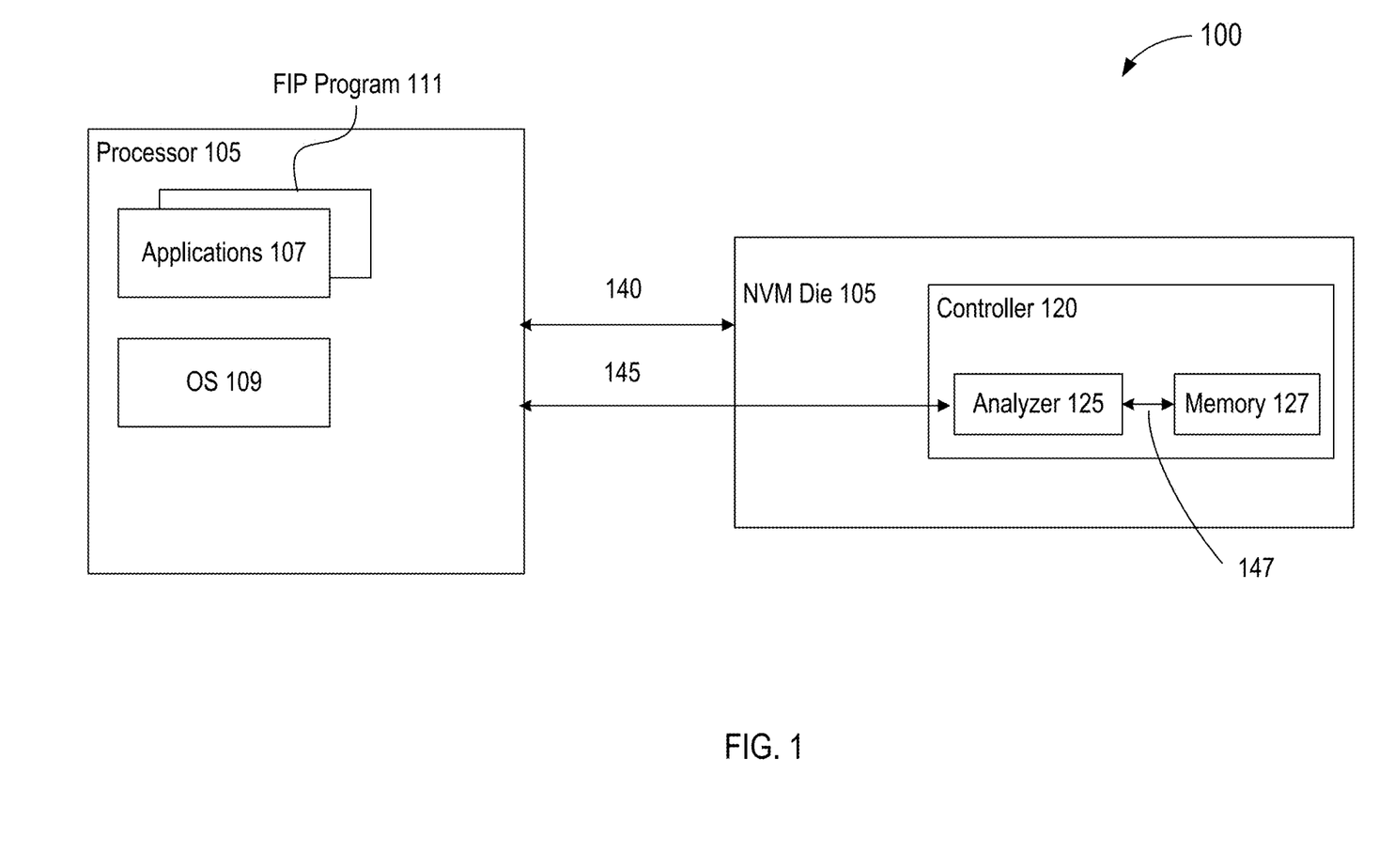
FIG. 1 illustrates a functional block diagram of a NVM die with an integrated controller provided in a computing system, in accordance with various embodiments.

FIG. 1 illustrates an example computer system 100 in accordance with various embodiments. With reference to FIG. 1, the example computer system includes processor 105, which may run one or more applications 107. In embodiments, one of applications 107 includes a FIP program 111, through which a user may view plots of data generated by controller 120 so as to visualize failure prediction for NVM die 105, such as, for example, the plots shown in FIGS. 4 and 5, described more fully below.

Figure 6:
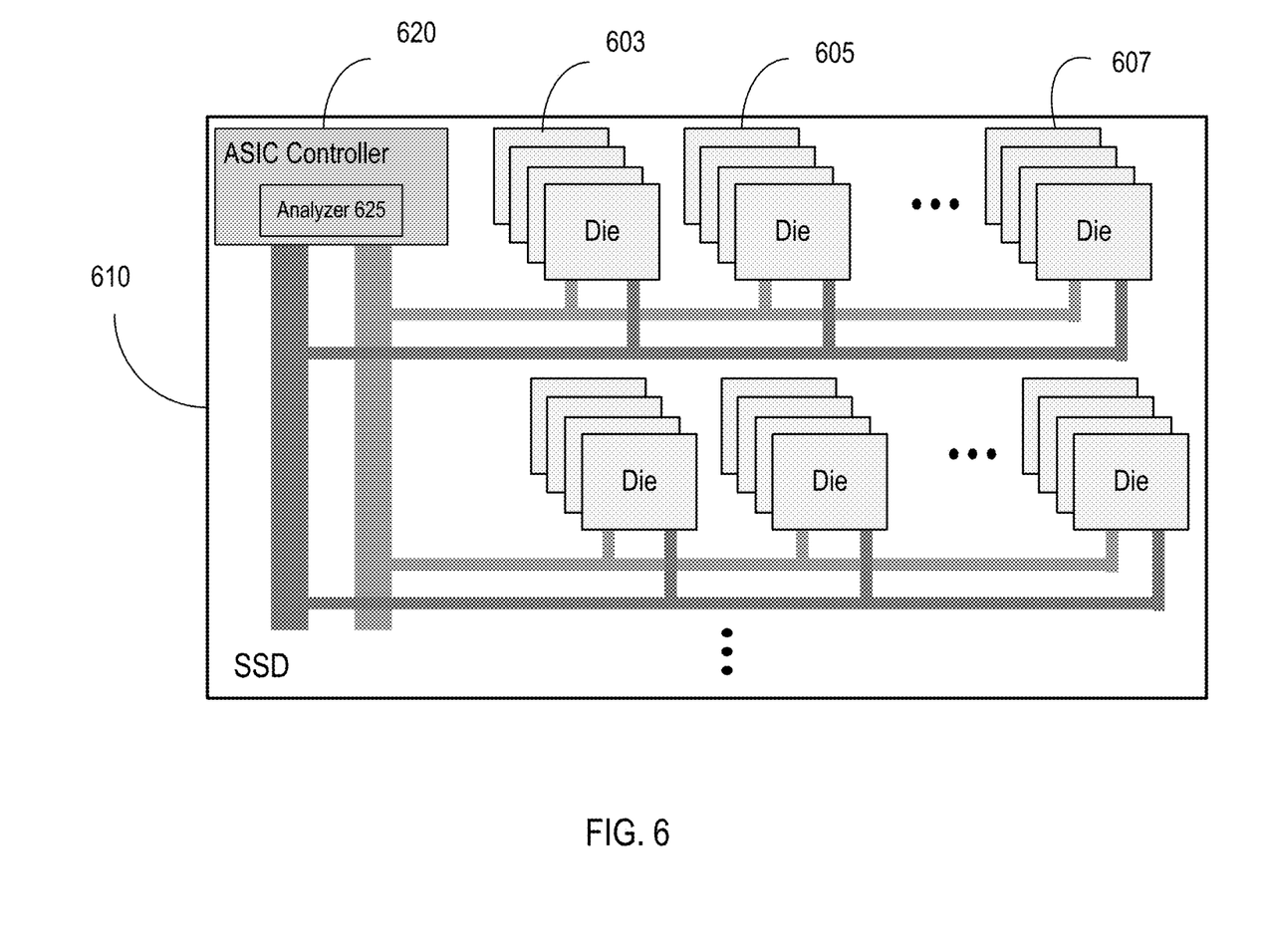
FIG. 6 illustrates an example SSD including a plurality of NVM dies and an ASIC controller, in accordance with various embodiments.

Processor 107 may further be running operating system (OS) 109. Moreover, processor 105 may be coupled to NVM die 105, over bus 140. While, in embodiments, NVM die 105 may include controller 120, it is here also noted that controller 120 may take various forms. For example, in one embodiment, controller 120 may comprise integrated circuitry on the NVM die 105 itself. Alternatively, controller 120 may comprise integrated circuitry on a memory module that includes a plurality of dies that are managed by a memory controller, such as, for example, an ASIC provided on a NVM module, such as a SSD or a NVM DIMM. This option is illustrated in FIG. 6, described below. Still alternatively, controller 120 may be integrated within a separate memory controller (not shown) separate from NVM die 105.

Continuing with reference to FIG. 1, controller 120 includes analyzer 125 and memory 127, the two of which may be connected via link 147. Memory 127 stores the results of both a RT and field tests, the latter of which may be performed by analyzer 125 at pre-defined intervals, as may be directed by either a manufacturer or a user. Analyzer 127 is connected to processor 105 over link 145, through which it may send data to an example application by which a user may view a prediction and associated plots, such as, for example, similar to those shown in FIGS. 3 and 4.

Figure 2:
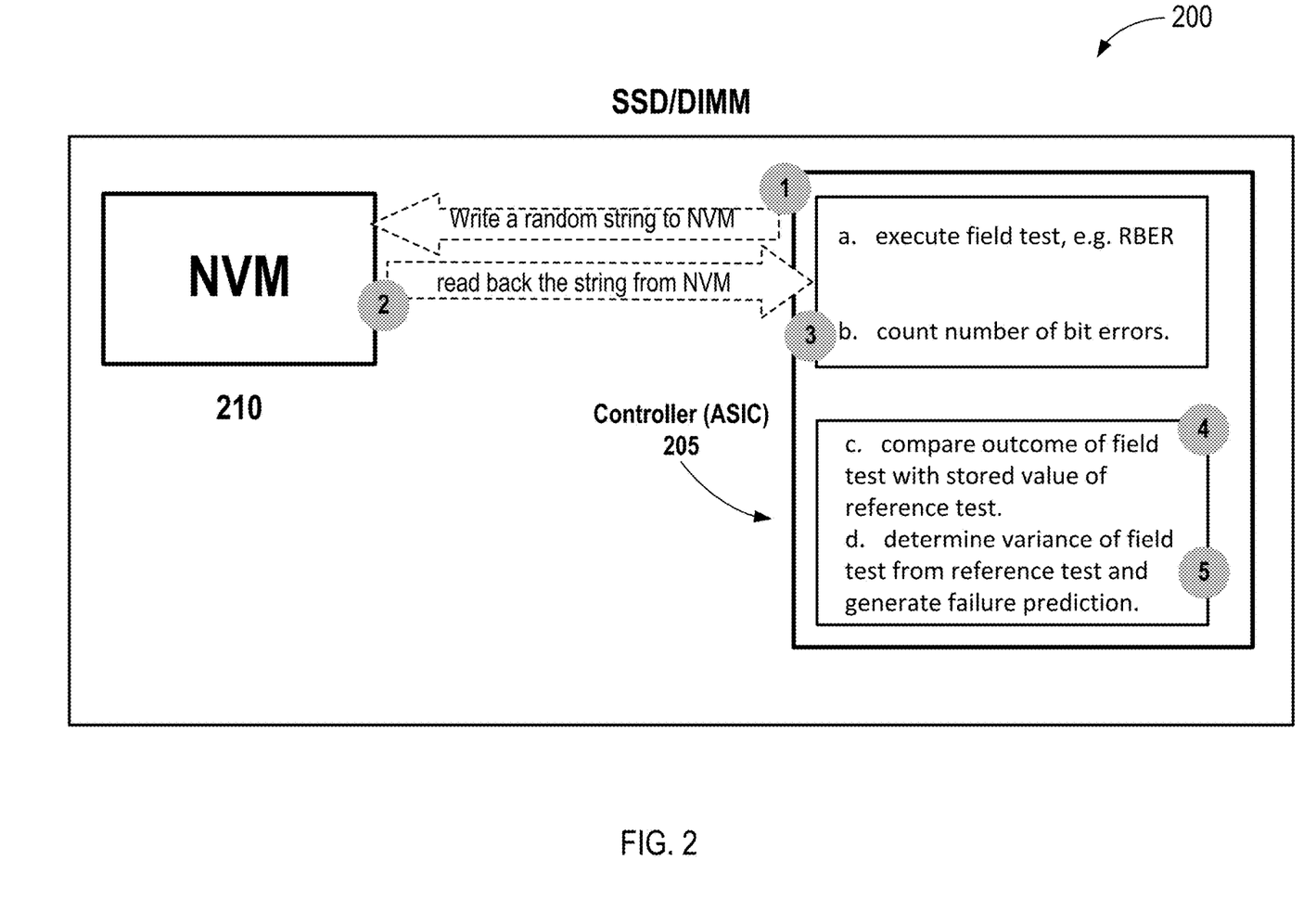
FIG. 2 illustrates a field test and failure prediction generation as performed by an example controller provided in an example SSD/DIMM, in accordance with various embodiments.

FIG. 2 illustrates an example field test and failure prediction performed by an example controller provided in an example SSD/DIMM, in accordance with various embodiments. With reference to FIG. 2, a SSD/DIMM module 200 is shown. SDD/DIMM module 200 includes NVM 210 and controller 205, which, in this example, may be an ASIC provided on the SSD/DIMM, similar to the embodiments described in reference to FIG. 1. In embodiments, the ASIC may be the memory controller for the SSD/DIMM, or it may be a specialized chip for FIP functionality. As noted above, in embodiments, controller 205 may be integrated into a memory controller coupled to the NVM die, which may be either integrated in a memory module, or be separate from it, such as, for example, as part of a processor, or as a separate chip.

Figure 3:
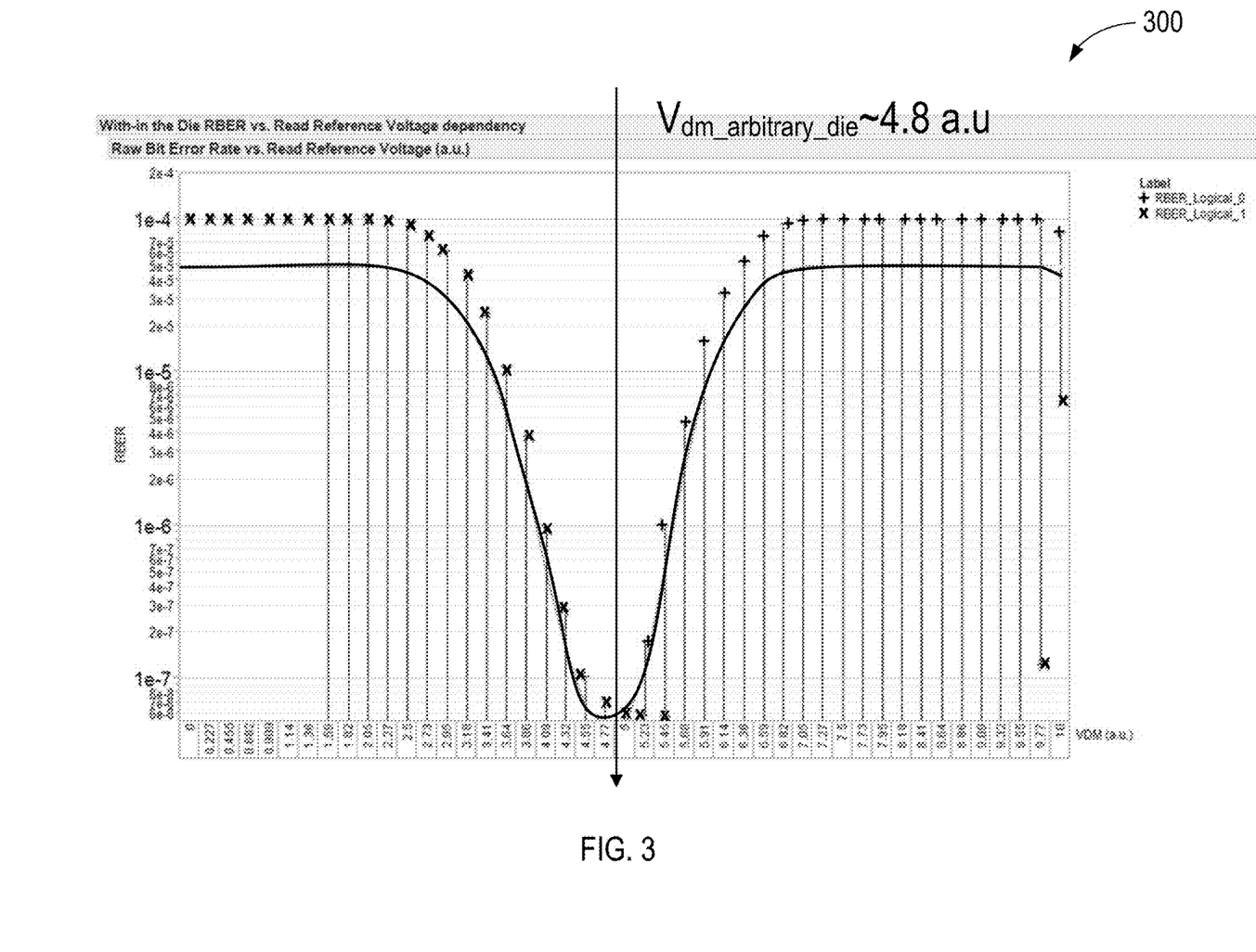
FIG. 3 depicts a plot representing the results of an initial reference test of an example NVM die, the plot depicting raw bit error rate (RBER) versus read reference voltage $V_{DM}$ for the die, in accordance with various embodiments.

Continuing with reference to FIG. 2, it is assumed that controller 205 has an associated memory, which may be provided within it, as shown in memory 127 of FIG. 1, or, for example, which may be within a range of memory addresses on the SSD/DIMM that are not available to the system, and which physically may be on one of the multiple NVM dies of the SSD/DIMM. In the memory, it is assumed that the results of an initial RT previously performed on the NVM die are stored. In embodiments, such an initial RT may be performed by the manufacturer of the NVM die, and the results of the RT may be provisioned into the memory of controller 205 when controller 205 is first paired with NVM 210. The RT may include writing a random bit string to a set of spatially distributed addresses on NVM 210, and then reading them back at a range of read reference voltages (VCM). Results of such a RT are shown in FIG. 3, described below.

Continuing with reference to FIG. 2, example tasks are shown that controller 205 may perform during a field test in accordance with various embodiments. Each of the tasks is labelled in FIG. 2 with a corresponding numeral in a circle. While five example tasks are shown, this number is exemplary only, and fewer or more tasks are also contemplated, in accordance with various embodiments. In a first task, task 1, controller 205 may write a random bit string to NVM 210. In embodiments, the random bit string will be the same as that used in the original RT, in order that a comparison of like results may be made. In embodiments, the random string may have a length greater than 1024 bits. In embodiments, controller 205 may write the random bit string to spatially distributed addresses on NVM 210.

In a second task, task 2, controller 205 may set one or more $V_{DMS}$, and read back the written string from the addresses at each $V_{DM}$. Setting a $V_{DM}$ for the read back is performed because, as shown in the plot of FIG. 3, raw bit error rate (RBER) is dependent upon $V_{DM}$. In embodiments, the $V_{DM}$ that was found to have minimum RBER in the RT may be saved in the memory of controller 205, and that same $V_{DM}$ used when reading back the random bit string of task 2. However, because $V_{DM}$ may drift over time and elapsed memory cycles (and may further change as a function of workload to which the NVM is put), in alternate embodiments, controller 205 reads back the random bit string at several $V_{DM}$ values, determines the then optimal or desired $V_{DM}$ versus number of errors, and uses the read back results at that $V_{DM}$ for comparison with the RT data, even though the RT and the field test now operate at a different optimal $V_{DM}$. Moreover, if an optimal $V_{DM}$ does change, controller 205 may also set that $V_{DM}$ as the new default $V_{DM}$ for memory reads at NVM 210.

In a third task, task 3, controller 205 may count the number of bit errors, and calculate the then extant RBER. This may be followed by a fourth task, task 4, where controller 205 compares the current RBER with that originally found in the RT for the same (elapsed cycles, elapsed time) input pair, which as noted, is stored in a memory of controller 205 (not shown). It is noted that upon receiving the read back data, in embodiments, the controller computes RBER without applying any error correction code, so as to obtain a fully accurate diagnosis of NVM 210.

In a fourth task, task 4, controller 205 compares the outcome of the RBER from the field test with the RBER of the RT, and in a fifth task, task 5, determines the variance of the performance of the NVM seen in the field test from that expected based on the RT, for the data point of (cycles, time) when the field test was performed. The results of that comparison may then be used to predict likelihood of failure of NVM 210, as well as future RBER percentages as a function of (cycles, time) going forward. These predictions are explained in further detail below with reference to FIGS. 4 and 5.

It is here noted that a primary objective of the RT is to characterize NVM dies, and to further adjust parameters for use in the field such that the SSD or DIMM maintains its performance over its lifespan. In embodiments, the RT test flow may simulate a SSD or DIMM's workload over its lifespan by collecting the number of bit failures at a certain number of cycles within a certain period of time as may be determined by the type of SSDs, e.g., enterprise or client. Results of the RT may be first stored in a trusted server, and subsequently stored on, for example, a SSD or DIMM controller, as shown in FIG. 2 when the NVM die and the controller are later paired.

As noted above, once a SSD/DIMM is deployed, the same type of tests as the RT may be executed at each field test. Field tests thus gather the same type of information that was acquired during the RT, for example, at the factory. The frequency of field tests may, in embodiments, be determined by an OEM of the NVM die based on an expected workload of the SDD/DIMM. It is noted that, in embodiments, results of the field tests may be temporary stored in controller memory until the comparison and prediction generation of example tasks 4 and 5 have been completed. After that, the field test results may, for example, be overwritten with results of a subsequent field test.

It is here noted that, in embodiments, there is a difference between the test protocol at the RT, and the test protocol at a field test. At the RT a sufficient number of memory cycles is run on certain redundant addresses of the NVM die to simulate a full life span (which may be 2-4 years, for example) of the memory at those addresses. Thus, for example, every NVM die initially tested in this manner has areas which are completely degraded. However, once the NVM die is put into use, the SSD/DIMM does not see those degraded areas because they are excluded from the accessible address span of the NVM die. However, in a field test, for example, such a full end-of-life (EOL) series of memory cycles is not run, as there is generally insufficient time to run the full flow of cycles that would normally be completed in 2-4 years of operation of the NVM die. Rather, instead, in embodiments, time may be accelerated for the field test by increasing the temperature of the NVM die during the field test. This is known as "burn-in," and, using Arrhenius' law, time vs temperature may be thereby extrapolated. This extrapolated data from a field test is then used to generate the predictive plots shown as 450 in FIG. 4, and 515 in FIG. 5.

As noted, to determine the apparent age of an NVM die, a comparison of its original RT with a subsequent field test is to be performed. FIG. 3 illustrates the results of an example factory test of an example NVM die, in accordance with various embodiments. FIG. 3 thus depicts a plot 300 of raw bit error rate (RBER) versus read reference voltage $V_{DM}$ for the example NVM die. It is here noted that the purpose of executing RBER at fabrication is to determine the optimal value of $V_{DM}$. By sweeping biasing parameters of a NVM, e.g., wordline and bitline voltages, the $V_{DM}$ that results in least RBER may be found, and that voltage may then be set for future reads of the NVM. As shown in FIG. 3, the RT results in a plot of RBER versus $V_{DM}$ for a range of voltages between 0 and 10 a.u. Having the results of the RT RBER test stored in a controller, an expected RBER for the given $V_{DM}$ may be checked against results of field tests for the die once it has been placed in operation. Continuing with reference to FIG. 3, the test tracks failures of logical 1s and 0s separately, but, as shown, the failure rates are essentially symmetric about the optimal $V_{DM}$ value. In this example RT the optimal $V_{DM}$ was found to be 4.8 arbitrary units (a.u.), which is a normalized voltage. As shown in FIG. 3, for voltages greater than 4.8 a.u., the failure rate of logical "0s" increases to a maximum, and for voltages below 4.8 a.u., the failure rate of logical "1s" increases to substantially the same maximum, or 0.0001, one bit out of every 10,000 being an error.

Figure 4:
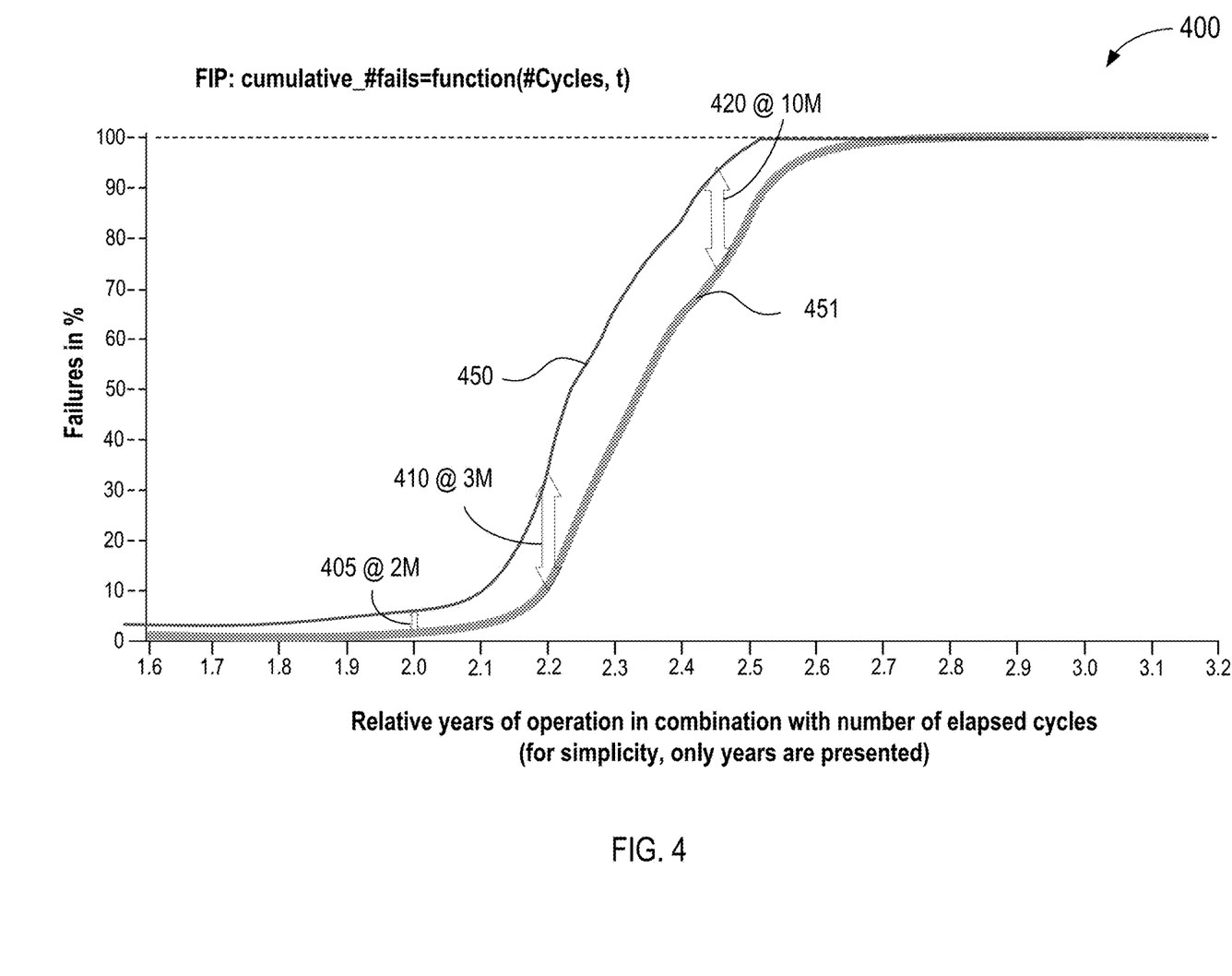
FIG. 4 depicts a plot representing the results of a subsequent field test, the plot depicting percentage bit failures versus relative years of operation for an example NVM die, in accordance with various embodiments.

FIG. 4 uses the results of a RT test performed at fabrication in the form of a plot of failures (%) versus relative years of operation of the NVM die, and compares that plot with a similar plot generated from field test data. FIG. 4 this compares two lifecycle plots of the same NM die, one generated at the RT, the other at a subsequent field test. As noted above, plot 451 represents a full lifecycle of a NVM die plot generated from original data obtained at the RT of the example NVM die. As noted above, this RT data generally includes a complete lifecycle test of a set of cells of the NVM die that are not available to a processor of a computer system in which the NVM is ultimately provided. In the RT, these "test" memory cells are subjected to a large number of memory cycles, sufficient to simulate a full lifecycle.

In embodiments, a memory cycle may be, for example, write/read, or read/write/read (for those memory technologies, where, prior to a write operation the memory controller first performs a read of the intended cell, and thus uses a read/write/read memory cycle). Thus, at the RT, these test cells are burned out, in the process of gathering data from running them over a full lifecycle of wear to characterize the failure percentage of the NVM as a function of relative years of operation. In embodiments, the term "relative years of operation" refers to a modification of actual years by also taking into consideration the number of elapsed memory cycles. In a field test, however, as noted above, time may be accelerated by increasing the temperature of the NVM die during the field test, in what is known as "burn-in." In embodiments, using Arrhenius' law, time vs temperature may be thereby extrapolated for each field test. As noted, in embodiments, it is this extrapolated filed test data that is used to generate the predictive plots 450 in FIG. 4 (and 515 in FIG. 5).

Continuing with reference to FIG. 4, plot 450 is a FIP plot for the same NVM whose points may be traced out following several field tests. As shown, the equation for the FIP plot 450 is:

cumulative_#fails=function(#Cycles,t), for some function of the two variables Cycles, and t.

By comparing the difference at any point in time between the two plots 450 and 451, the analyzer of the controller may determine the "apparent age" of the NVM die (again, a function of both elapsed memory cycles and actual time), and thus whether it has a greater likelihood of failing relative to what was expected when the RT was performed. If so, a failure prediction may be generated.

For example, at point 405, occurring at a relative age of 2 years, where 2 Million cycles have elapsed, the delta between RT predicted lifecycle plot 451 and FIP plot 450 is minimal, and the point on the FIP curve 450 itself at point 405 is less than 10%. Thus the NVM die may be expected—at this point in time—to follow the RT based predicted lifecycle, and thus no failure is foreseen. However, as may be seen at points 410 and 420, the NVM die ultimately aged faster than expected, and thus a prediction of its failure ahead of time would be made at each of points 410 and 420 following a field test. Thus, at point 410, at 3M elapsed cycles, the delta between the two curves in increasing, and the FIP curve is now greater than 30%. While no imminent failure is predicted, the health of the NVM die is deteriorating faster than expected. At point 420, after 10M elapsed memory cycles, at a relative age of 2.45 years, the FIP curve is well above 90%, and thus an imminent failure may be predicted.

Figure 5:
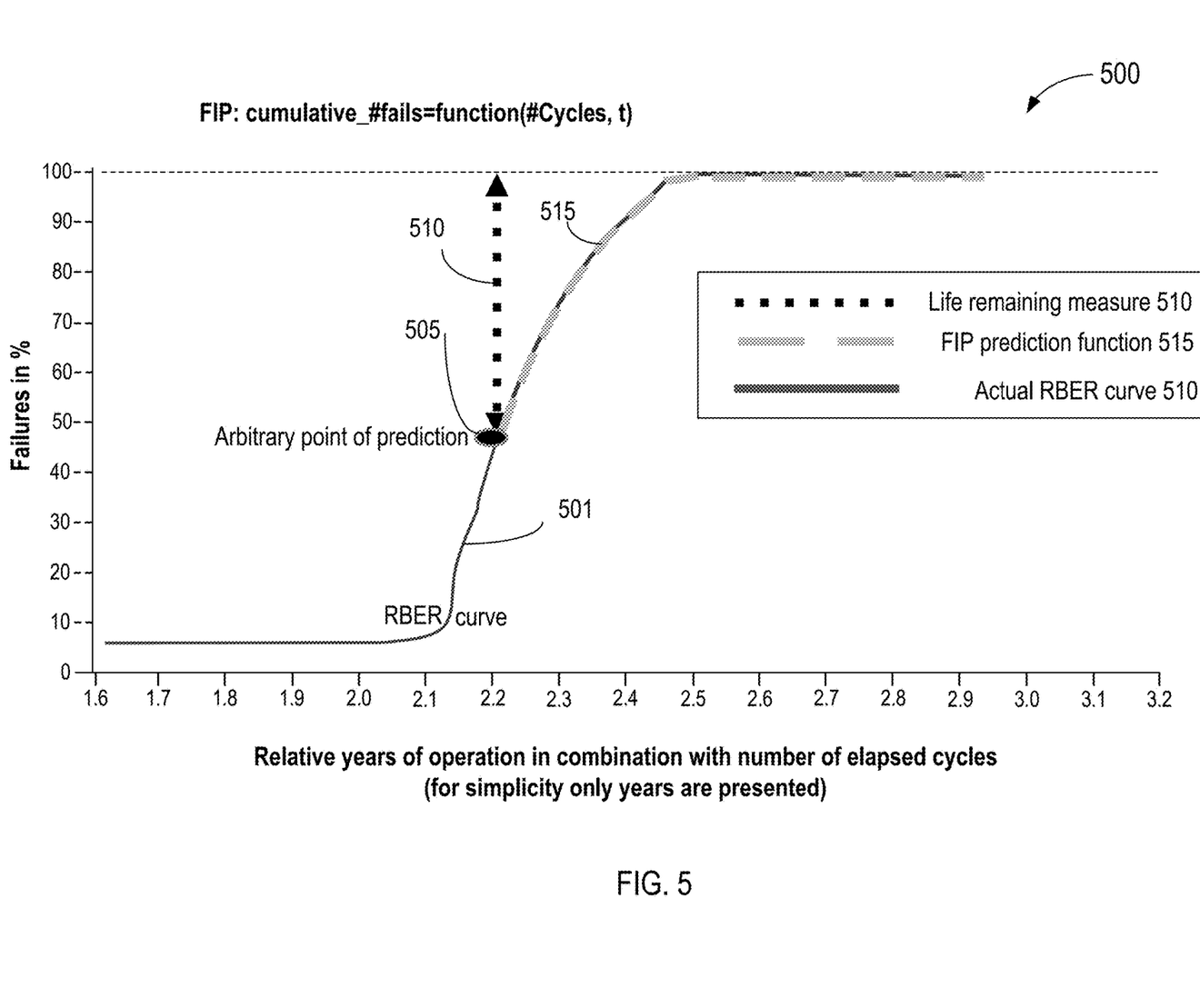
FIG. 5 depicts a plot of predicted future percentage bit failures versus relative years of operation for the example NVM die of FIG. 4, superimposed upon an original RBER curve representing results of an initial reference test for the example NVM die, in accordance with various embodiments.

FIG. 5 depicts a plot of predicted future percentage bit failures versus relative years of operation, for the example NVM die of FIG. 4, superimposed upon an actual RBER curve for the NVM die, in accordance with various embodiments. FIG. 5 also illustrates the benefits of FIP prediction over conventional NVM health detection approaches that implement a binary evaluation.

As noted above, standard approaches do not generate a prediction of cumulative fails as a function of both elapsed cycles and elapsed operational time. Thus, a conventional approach, illustrated by the "life remaining measure" arrow 510 of FIG. 5, only indicates the current status, and can only provide remaining budget for the die in terms of a total remaining number of cycles, based on a static assumption as to how many cycles each die can be expected to support. On the other hand, FIP curve 515 generates an actual future prediction of failure percentage as a function of both number of cycles and time, going forward through the EOL of the die. Moreover, unlike the static analysis represented by arrow 510 that only says "there are X cycles left", FIP prediction curve 515 presents how the coming degradation will vary in time (e.g., the slope of the REBR curve at each data point going forward).

It is noted that FIP prediction according to various embodiments may be especially useful for 3D Xpoint™ based products, or the like, which may suffer memory-array intrinsic acceleration of information loss with number of elapsed cycles, which causes degradation, such as, for example, voltage drift amplification with time and/or which may additionally cause a RBER curve to behave non-linearly. Furthermore, in embodiments, FIP leverages self-diagnostic capabilities of the die, and thus, in embodiments, the delta between a field test based FIP curve (450 of FIG. 4) and a RT based lifecycle curve (451 of FIG. 4) may be used to track abnormal system usage, such as when the delta between the two curves remains constant, but the FIP is significantly above the RT predicted lifecycle curve. Such a constant positive delta may indicate that the system is being used improperly, or that there is a corner case workload running on it. In such cases a pop-up warning may be displayed to a user.

In embodiments, FIP acquired information may be available, for example, in a SD implementation, through SMART/NVMe log pages. Thus, in such implementations, standard software tools may be used to acquire the data from an SSD controller. As a result, existing infrastructure may be fully reused to handle access of example FIP output information by an end-user. Moreover, in embodiments, the analyzer, or FIP processing engine, may be fully protected by encryption, and thus not visible to a user.

FIG. 6 illustrates an example SSD 610 including a plurality of NVM dies and an ASIC controller, in accordance with various SSD based embodiments. With reference thereto, SSD 610 may include ASIC controller 620, which may include analyzer 625. Analyzer 625 may perform field tests and analyze their results relative to a stored RT result in the same manner as described above for controller 205, with reference to FIG. 2. Analyzer 625 may thus, in embodiments, perform failure prediction for each of the plurality of NVM dies included within SSD 610, such as, for example, those comprising rows 603, 605, 607, etc. In this example embodiment, the results of the RT and the field tests may be stored in one or more hidden memory cells of the SSD that are not available to a processor, and not associated with accessible memory locations as seen by the processor. In some embodiments, analyzer 625 may also be programmed to automatically remove a NVM die from service when a certain RBER threshold is passed, and off load its contents to other memory cells. In such embodiments, this feature prevents failure if a user does not, for some reason, attend to a failure warning. The analyzer may isolate the failing die and alert a user that it is offline, and needs maintenance or rebuild, and the die would remain offline until the required maintenance has been performed.

Figure 7:
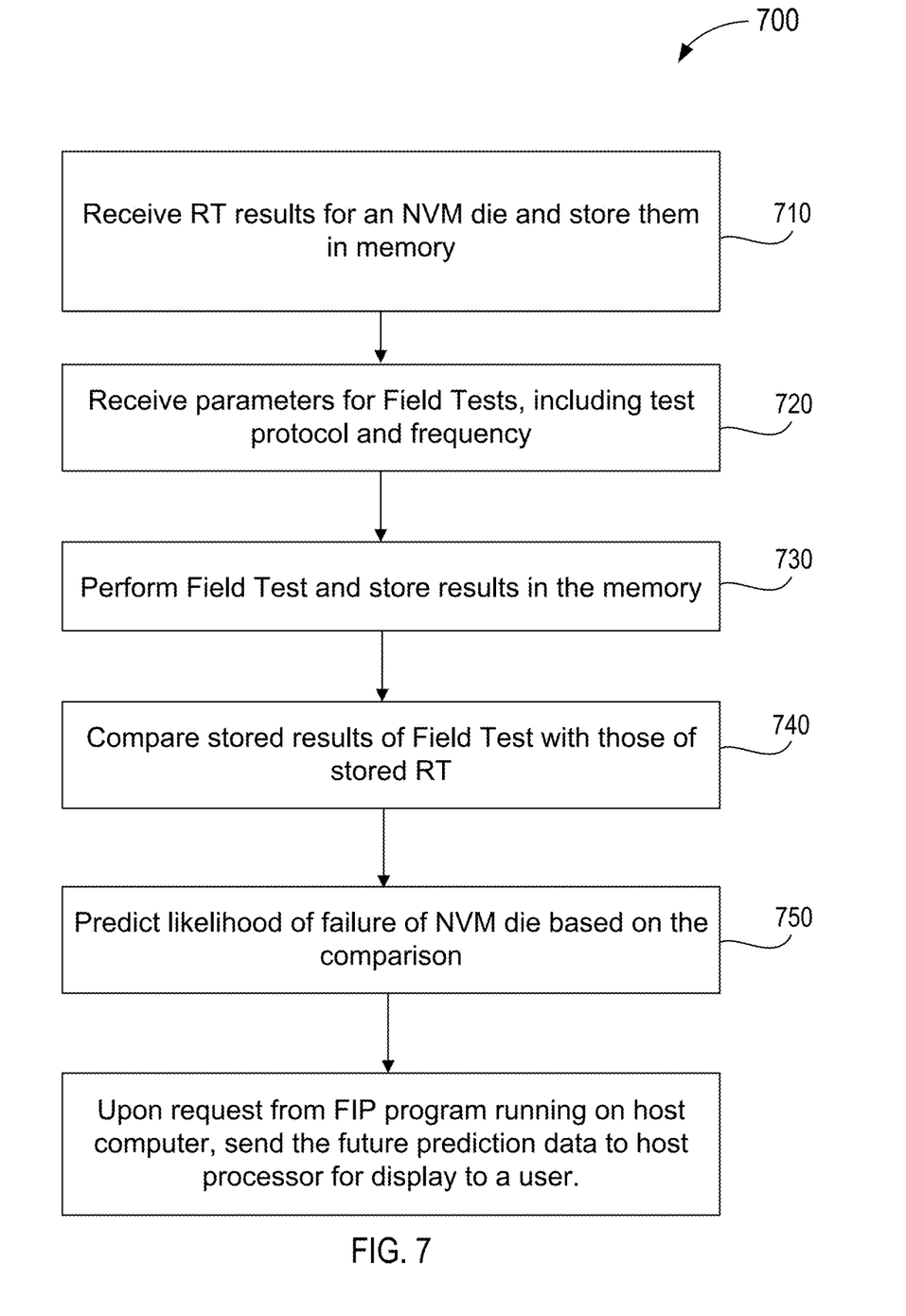
FIG. 7 illustrates an overview of the operational flow of a process for performing a field test and predicting likelihood of failure of a NVM die, in accordance with various embodiments.

Referring now to FIG. 7, an overview of the operational flow of a process for receiving RT results, receiving field test parameters, performing a field test and predicting the likelihood of failure of a NVM die, in accordance with various embodiments, is presented. Process 700 may be performed, for example, by an apparatus such as controller 120, shown in FIG. 1, ASIC 205, as shown in FIG. 2, or ASIC 625 shown in FIG. 6. Process 700 includes blocks 710 through 750. In alternate embodiments, process 700 may have more or less operations, and some of the operations may be performed in different order.

Process 700 begins at block 710, where a controller receives RT results of an NVM die and stores them in memory. For example, the RT results may be a full lifecycle test of the NVM die, such as bit failure percentage rate as a function of cycles and time, such as is shown in plot 451 of FIG. 4, as described above. In embodiments, the RT results are obtained at the time of manufacture, prior to the controller being coupled to the NVM die, and initially stored on servers maintained by the manufacturer. Later, for example, when the NVM die is paired with the controller, the RT results are provisioned stored in, for example, a memory of the controller or a memory coupled to the controller, such as a protected portion of one of the various NVM dies 603, 605 or 607, as illustrated in FIG. 6.

From block 710, process 700 proceeds to block 720, where the controller receives parameters for field tests, including test protocol and frequency of field tests. As noted above, this data may be provided to the controller because it was not present when the RT was performed, and thus needs to be programmed with the proper test protocol. As in the case of the provisioned RT results, the test protocol and field test frequency may be stored in a memory of the controller, or a memory accessible by the controller, at the time of pairing it with the NVM die.

From block 720, process 700 proceeds to block 730, where the controller performs a field test of the NVM die and stores the results in the memory.

From block 730, process 700 proceeds to block 740, where the controller compares the stored results of the field test with the stored results of the RT. For example, the controller may calculate a delta between the RT value for bit failure percentage for a given (cycles, time) pair of independent variables, with the field test bit failure percentage value for the same (cycle, time) pair, such as is shown, for example at point 410 of FIG. 4.

Finally, from block 740, process 700 proceeds to block 750, where the controller predicts a likelihood of failure of the NVM die based on the comparison of the field test results with the stored results of the RT.

Figure 8:
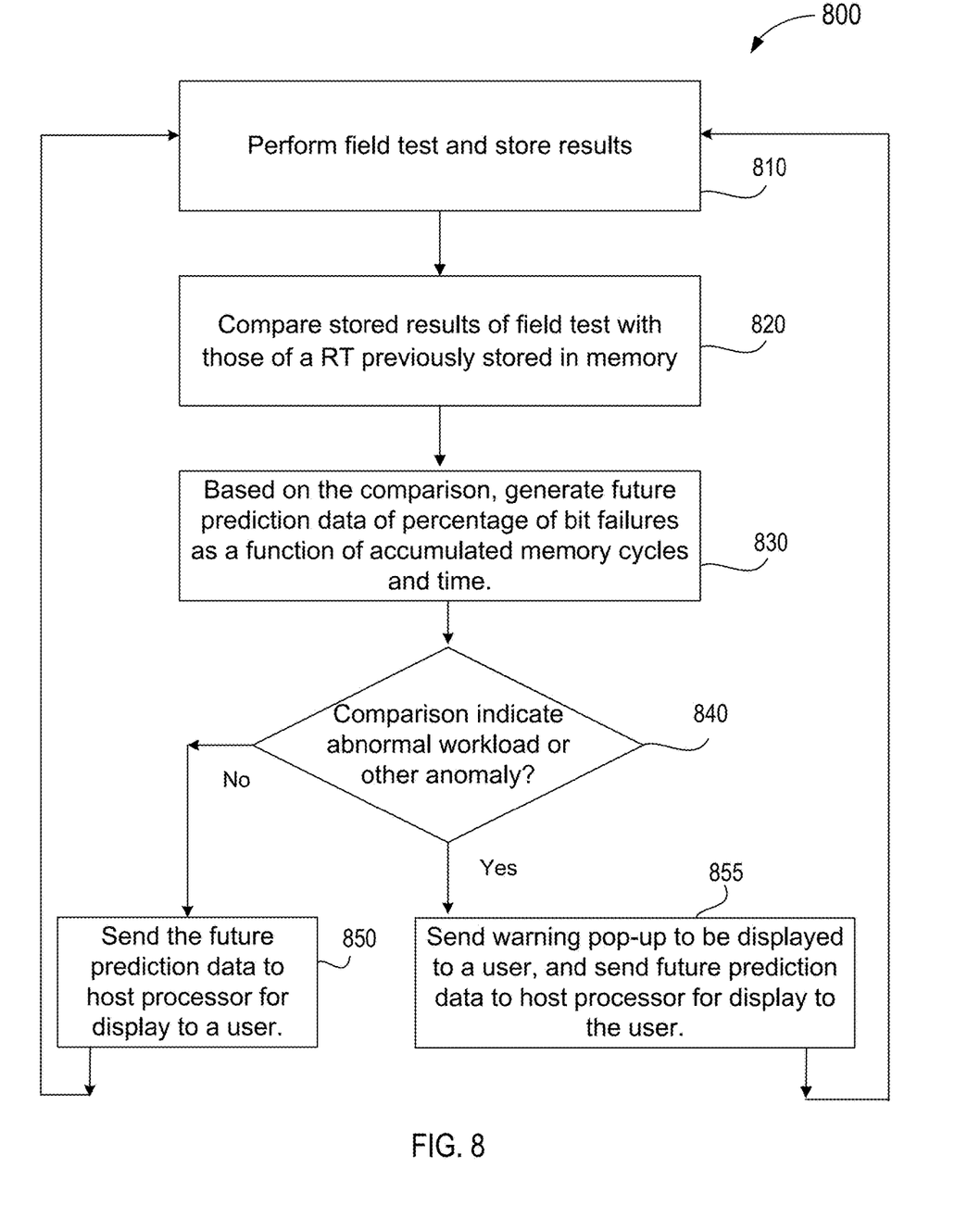
FIG. 8 illustrates an overview of the operational flow of a process for performing a field test, generating future prediction data for a NVM die and determining if the die is being put to an abnormal workload or if another anomaly is operative, in accordance with various embodiments.

Referring now to FIG. 8, an overview of the operational flow of a process 800 for performing a field test and predicting the likelihood of failure of a NVM die, as well as for detecting an abnormal workload or other anomaly of the die, is presented in accordance with various embodiments. Process 800 may be performed by an apparatus such as, for example, controller 120, shown in FIG. 1, ASIC 205, as shown in FIG. 2, or ASIC 625 shown in FIG. 6. Process 800 includes blocks 810 through 855. In alternate embodiments, process 800 may have more or less operations, and some of the operations may be performed in different order.

Process 800 begins at block 810, where the controller performs a field test of the NVM die and stores the results of the field test in a memory of, or one accessible by, the controller.

From block 810, process 800 proceeds to block 820, where the controller compares the stored results of the field test with those of a RT previously stored in the memory. As noted above, the results of the RT may first be obtained at the time of manufacture of the NVM die, and then subsequently provisioned in the controller, or in a memory of the controller. To perform the comparison, for example, the controller may calculate a delta between the bit failure percentage at a given (cycles, time) pair of independent variables from the RT results, with a bit failure percentage value for the same (cycle, time) pair in the field test results, such as is shown, for example, at points 405, 410 and 420 of FIG. 4.

From block 820, process 800 proceeds to block 830, where the controller, based on the comparison, generates future prediction data of percentage of bit failures as a function of accumulated memory cycles and time. It is noted that as used herein, the phrase "accumulated memory cycles and time" refers to an apparent age of the NVM die, which is some combination of its actual age in terms of the time it has been in use, and the total number of memory cycles it has performed. For example, at block 830, process 800 may generate the data for a plot such as FIP prediction function 515, as shown in FIG. 5, which tracks how bit failure percentages may vary over a combination of accumulated memory cycles and time for the NVM die, from a prediction point 505 until an EOL of the NVM die.

From block 830, process 800 proceeds to query block 840, where the controller determines if, based on the comparison performed at block 820, if the NVM die has been (or is) subjected to an abnormal workload, or if another anomaly is operative. For example, as noted above in connection with the plots of FIG. 4, the delta between a field test based FIP curve (e.g., 450 of FIG. 4) and a RT based NVM die lifecycle curve (e.g., 451 of FIG. 4) may be used to track abnormal system usage, such as when the delta between the two curves remains constant, but the FIP is significantly above the RT predicted lifecycle curve. Such a constant positive delta may indicate that the system is being used improperly, or that there is a corner case workload running on it. If, at query block 840 a "Yes" is returned, then process 800 moves to block 855, where the controller sends a warning pop-up to a host processor to be displayed to a user. The controller also sends the future prediction data to the host processor for display to user, such as, for example, in an FIP application. On the other hand, if "No" at query block 840 is returned, then process 800 moves to block 850, where the controller sends the future prediction data to the host processor for display to user, such as, for example, in the FIP application.

From either block 850, or block 855, process 800 returns to block 810 for the next scheduled field test.

Figure 9:
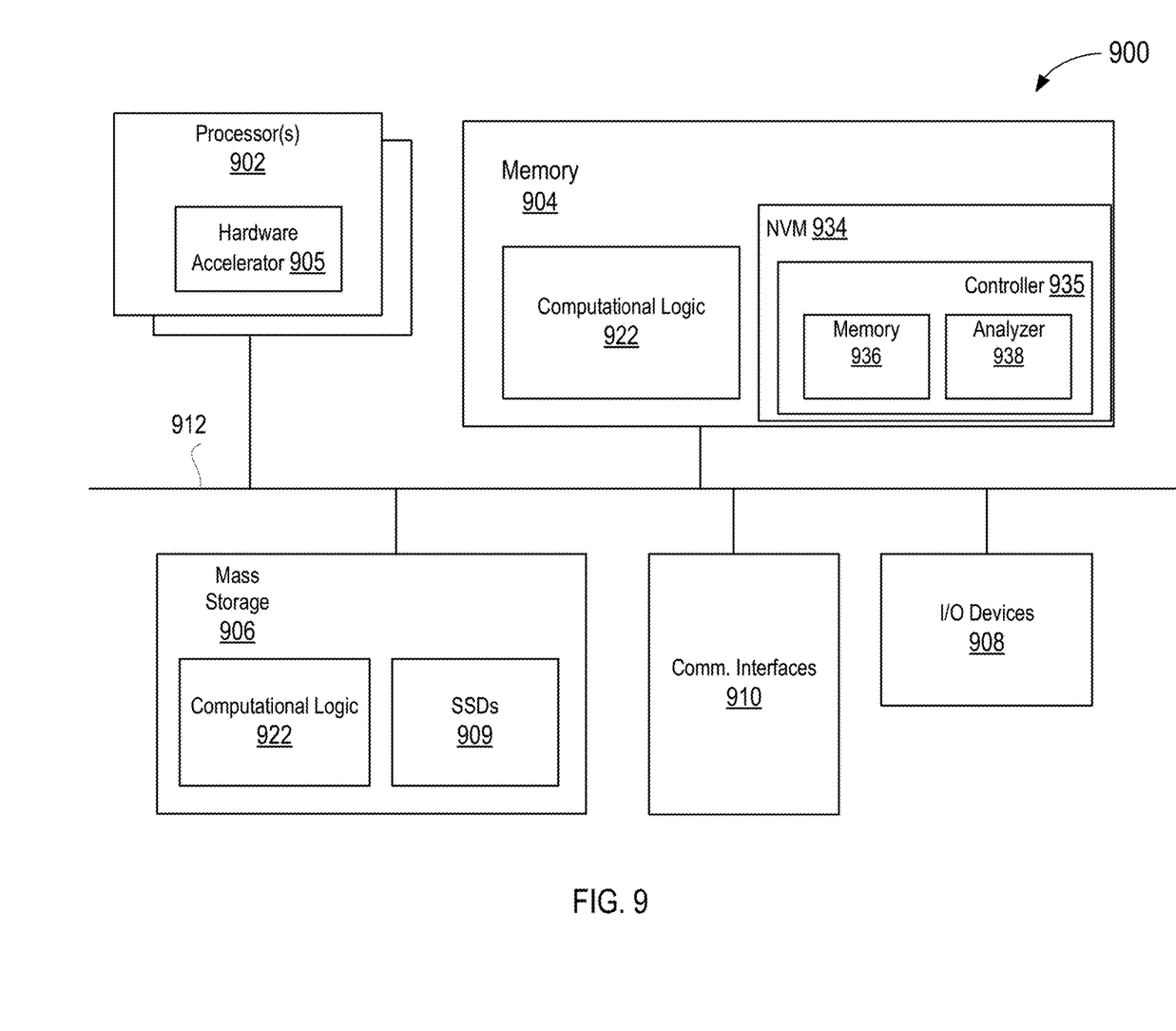
FIG. 9 illustrates a block diagram of a computer device suitable for practicing the present disclosure, in accordance with various embodiments.

Referring now to FIG. 9 wherein a block diagram of a computer device suitable for practicing the present disclosure, in accordance with various embodiments, is illustrated. As shown, computer device 900 may include one or more processors 902, memory controller 903, and system memory 904. Each processor 902 may include one or more processor cores, and hardware accelerator 905. An example of hardware accelerator 905 may include, but is not limited to, programmed field programmable gate arrays (FPGA). In embodiments, processor 902 may also include a memory controller (not shown). In embodiments, system memory 904 may include any known volatile or non-volatile memory, including, for example, NVM 934. NVM 934 may include controller 935, which itself may include memory 936 and analyzer 938. Controller 935 may perform a FIP function as described in detail above.

Additionally, computer device 900 may include mass storage device(s) 906 (such as SSDs 909), input/output device interface 908 (to interface with various input/output devices, such as, mouse, cursor control, display device (including touch sensitive screen), and so forth) and communication interfaces 910 (such as network interface cards, modems and so forth). In embodiments, communication interfaces 910 may support wired or wireless communication, including near field communication. The elements may be coupled to each other via system bus 912, which may represent one or more buses. In the case of multiple buses, they may be bridged by one or more bus bridges (not shown). It is here noted that although not shown, when mass storage 906 includes SSDs, such SSDs may also include an integrated controller, such as controller 935, to perform an FIP function for SSDs 909.

In embodiments, system memory 904 and mass storage device(s) 906 may be employed to store a working copy and a permanent copy of the executable code of the programming instructions of an operating system, one or more applications, and/or various software implemented components of processor 105 and controller 120, both of FIG. 1, or of ASIC controller 205 of FIG. 2, or ASIC controller 620 (including analyzer 625) of FIG. 6, collectively referred to as computational logic 922. The programming instructions implementing computational logic 922 may comprise assembler instructions supported by processor(s) 902 or high-level languages, such as, for example, C, that can be compiled into such instructions. In embodiments, some of computing logic may be implemented in hardware accelerator 905. In embodiments, part of computational logic 922, e.g., a portion of the computational logic 922 associated with the runtime environment of the compiler may be implemented in hardware accelerator 905.

The permanent copy of the executable code of the programming instructions or the bit streams for configuring hardware accelerator 905 may be placed into permanent mass storage device(s) 906 and/or hardware accelerator 905 in the factory, or in the field, through, for example, a distribution medium (not shown), such as a compact disc (CD), or through communication interface 910 (from a distribution server (not shown)). While for ease of understanding, the compiler and the hardware accelerator that executes the generated code that incorporate the predicate computation teaching of the present disclosure to increase the pipelining and/or parallel execution of nested loops are shown as being located on the same computing device, in alternate embodiments, the compiler and the hardware accelerator may be located on different computing devices.

The number, capability and/or capacity of these elements 910-912 may vary, depending on the intended use of example computer device 900, e.g., whether example computer device 900 is a smartphone, tablet, ultrabook, a laptop, a server, a set-top box, a game console, a camera, and so forth. The constitutions of these elements 910-912 are otherwise known, and accordingly will not be further described.

Figure 10:
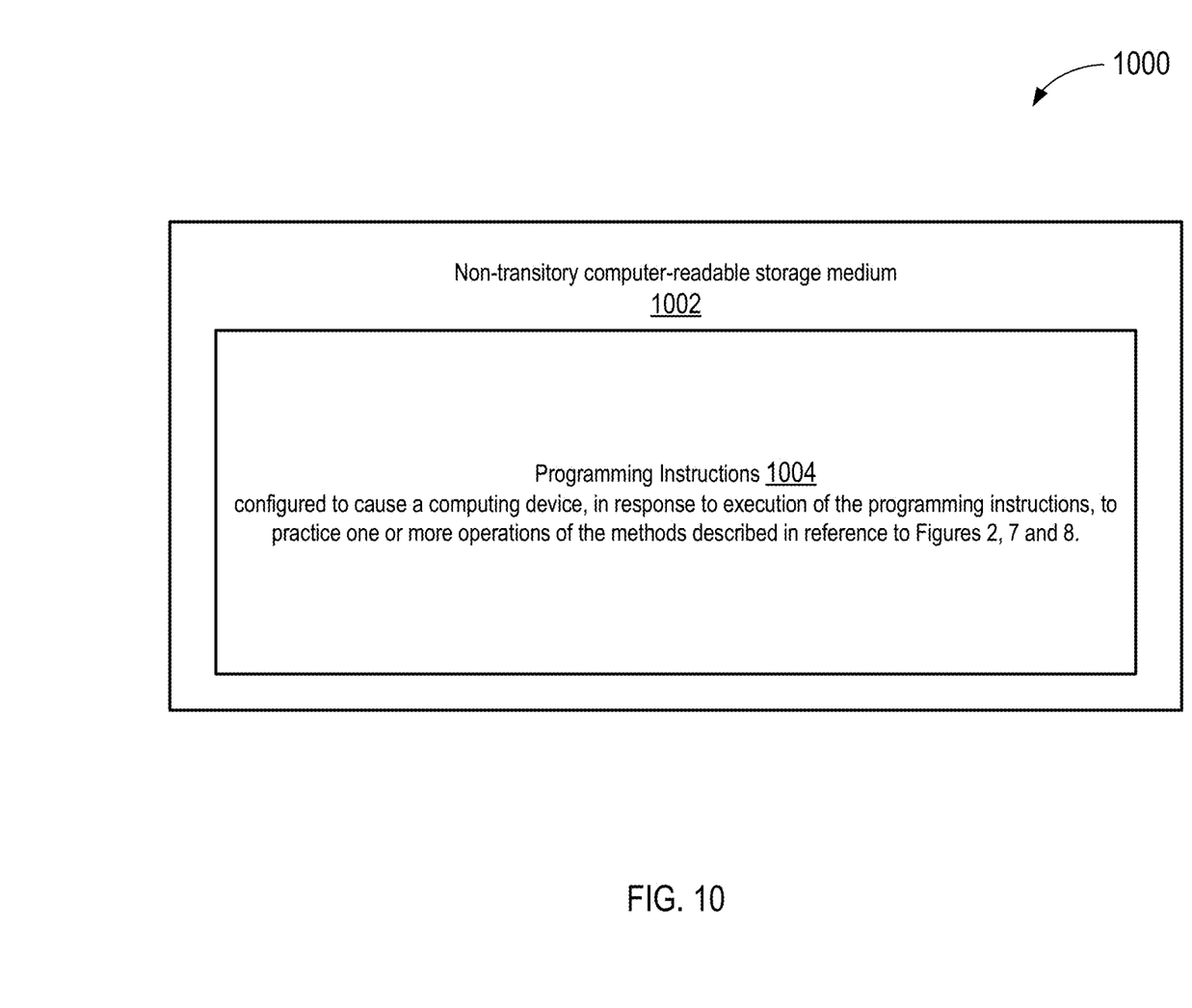
FIG. 10 illustrates an example computer-readable storage medium having instructions configured to practice aspects of the processes of FIGS. 2, 7 and 8, in accordance with various embodiments.

FIG. 10 illustrates an example computer-readable storage medium having instructions configured to implement all (or portion of) software implementations of processor 105 and controller 120, both of FIG. 1, or of ASIC controller 205 of FIG. 2, or ASIC controller 620 (including analyzer 625) of FIG. 6, and/or practice (aspects of) processes performed by ASIC controller 205 of FIG. 2, process 700 of FIG. 7 and process 800 of FIG. 8, earlier described, in accordance with various embodiments. As illustrated, computer-readable storage medium 1002 may include the executable code of a number of programming instructions or bit streams 1004. Executable code of programming instructions (or bit streams) 1004 may be configured to enable a device, e.g., computer device 900, in response to execution of the executable code/programming instructions (or operation of an encoded hardware accelerator 975), to perform (aspects of) processes performed by ASIC controller 205 of FIG. 2, process 700 of FIG. 7 and process 800 of FIG. 8. In alternate embodiments, executable code/programming instructions/bit streams 1004 may be disposed on multiple non-transitory computer-readable storage medium 1002 instead. In embodiments, computer-readable storage medium 1002 may be non-transitory. In still other embodiments, executable code/programming instructions 1004 may be encoded in transitory computer readable medium, such as signals.

Referring back to FIG. 9, for one embodiment, at least one of processors 902 may be packaged together with a computer-readable storage medium having some or all of computing logic 922 (in lieu of storing in system memory 904 and/or mass storage device 906) configured to practice all or selected ones of the operations earlier described with reference to FIGS. 2, 7 and 8. For one embodiment, at least one of processors 902 may be packaged together with a computer-readable storage medium having some or all of computing logic 922 to form a System in Package (SiP). For one embodiment, at least one of processors 902 may be integrated on the same die with a computer-readable storage medium having some or all of computing logic 922. For one embodiment, at least one of processors 902 may be packaged together with a computer-readable storage medium having some or all of computing logic 922 to form a System on Chip (SoC). For at least one embodiment, the SoC may be utilized in, e.g., but not limited to, a hybrid computing tablet/laptop.

Illustrative examples of the technologies disclosed herein are provided below. An embodiment of the technologies may include any one or more, and any combination of, the examples described below.

EXAMPLES

Example 1 is a memory controller (MC), comprising: a memory, to store results of a reference performance test (RT) performed on a non-volatile memory (NVM) die, wherein the results of the RT comprise one or more first indicators of failure associated with one or more first read and write cycles of the NVM die before the NVM die is placed in use; and an analyzer coupled with the memory, to: perform, in one or more second read/write cycles one or more field tests that provide second indicators of failure associated with one or more second read/write cycles of the NVM die during the use of the NVM die; and predict and dynamically adjust, over the one or more second read/write cycles, at least one of likelihood or expected time of failure of the NVM, based at least in part on the first and second indicators of failure.

Example 2 is the MC of example 1, and/or any other example herein, wherein the memory is to store results of the one or more field tests that comprise the second indicators of failure.

Example 3 is the MC of example 2, and/or any other example herein, wherein the analyzer is to compare the first and second indicators of failure, wherein the prediction is based at least in part on a result of the comparison.

Example 4 is the MC of example 1, and/or any other example herein, wherein the NVM is one of a solid state device (SSD) or a dual in-line memory module (DIMM).

Example 5 is the MC of example 1, and/or any other example herein, wherein the memory controller is integrated in the SSD or DIMM.

Example 6 is the MC of example 1, and/or any other example herein, wherein following each field test the analyzer is further to generate a prediction of future bit failure percentages as a function of both cumulative memory cycles and time.

Example 7 is the MC of example 6, and/or any other example herein, wherein the prediction comprises a continuous function of percentages of bit failures for the time interval beginning with the field test and ending at an end of life of the NVM die.

Example 8 is the MC of example 1, and/or any other example herein, wherein the RT results are stored in the memory when the controller is paired with the NVM.

Example 9 is the MC of example 1, and/or any other example herein, wherein the analyzer is further to perform the one or more field tests at a pre-defined frequency set by a manufacturer of the NVM, and wherein the results of each field test are stored in the memory so as to overwrite the results of a previous field test.

Example 10 is the MC of example 1, and/or any other example herein, wherein each of the RT and the one or more field tests comprise a failure collection test (FCT) that mimics the lifespan of the NVM's expected workload and collects a number of failures at a predefined number of cycles within a predefined time unit.

Example 11 is one or more non-transitory computer-readable storage media comprising a set of instructions, which, when executed by a MC comprising a memory and coupled to a NVM die, cause the controller to: perform, in one or more first read/write cycles of the NVM die one or more field tests that provide first indicators of failure associated with one or more first read/write cycles of the NVM die during the use of the NVM die; and compare the results of the field test with the results of a RT of the NVM die, the results of the RT comprising one or more second indicators of failure associated with one or more second read and write cycles of the NVM die before the NVM die was placed in use; and predict and dynamically adjust, over the one or more first read/write cycles, at least one of likelihood or expected time of failure of the NVM, based at least in part on the first and second indicators of failure.

Example 12 is the one or more non-transitory computer-readable storage media of example 11, and/or any other example herein, wherein the instructions, when executed, further cause the MC to generate a prediction of future bit failure percentages as a function of both memory cycles and time.

Example 13 is the one or more non-transitory computer-readable storage media of example 11, and/or any other example herein, wherein the RT is performed at a time of fabrication of the NVM die, and its results stored in the memory when the MC is later paired with the NVM die.

Example 14 is the one or more non-transitory computer-readable storage media of example 11, and/or any other example herein, wherein the RT and the one or more field tests each include writing a random string to the NVM, reading it back, and counting the number of bit failures.

Example 15 is the one or more non-transitory computer-readable storage media of example 11, and/or any other example herein, wherein the instructions, when executed, further cause the MC to perform the one or more field tests at a pre-defined frequency set by a manufacturer of the NVM.

Example 16 is a system, comprising: a NVM die; and a MC, the MC comprising: a memory, to store results of a reference performance test (RT) performed on a non-volatile memory (NVM) die, wherein the results of the RT comprise one or more first indicators of failure associated with one or more first read and write cycles of the NVM die before the NVM die is placed in use; and an analyzer coupled with the memory, to: perform, in one or more second read/write cycles one or more field tests that provide second indicators of failure associated with one or more second read/write cycles of the NVM die during the use of the NVM die; and predict and dynamically adjust, over one or more second read/write cycles, at least one of likelihood or expected time of failure of the NVM, based at least in part on the first and second indicators of failure.

Example 17 is the system of example 16, and/or any other example herein, wherein the NVM is one of a solid state device (SSD) or a dual in-line memory module (DIMM), and the controller is integrated in the SSD or DIMM.

Example 18 is the system of example 16, and/or any other example herein, wherein the analyzer is to compare the first and second indicators of failure, and wherein the prediction is based at least in part on a result of the comparison.

Example 19 is the system of example 16, and/or any other example herein, wherein the RT and the one or more field tests each comprise a failure collection test (FCT) that mimics the lifespan of the NVM's expected workload and collects a number of failures at a predefined number of memory cycles within a predefined time unit.

Example 20 is the system of example 19, and/or any other example herein, wherein to predict and dynamically adjust the likelihood or expected time of failure of the NVM further includes to calculate a delta between the RT FCT and the field test FCT.

Example 21 is an apparatus for computing, comprising: means for storing results of a reference performance test (RT) performed on a non-volatile memory (NVM) die, wherein the results of the RT comprise one or more first indicators of failure associated with one or more first read and write cycles of the NVM die before the NVM die is placed in use; and means for analyzing coupled with the means for storing, to: perform, in one or more second read/write cycles one or more field tests that provide second indicators of failure associated with one or more second read/write cycles of the NVM die during the use of the NVM die; and predict and dynamically adjust, over the one or more second read/write cycles, at least one of likelihood or expected time of failure of the NVM, based at least in part on the first and second indicators of failure.

Example 22 is the apparatus for computing of Example 21, and/or any other example herein, wherein the means for storing is to store results of the one or more field tests that comprise the second indicators of failure.

Example 23 is the apparatus for computing of example 22, and/or any other example herein, wherein the means for analyzing is to compare the first and second indicators of failure, wherein the prediction is based at least in part on a result of the comparison.

Example 24 is the apparatus for computing of example 21, and/or any other example herein, wherein the NVM is one of a solid state device (SSD) or a dual in-line memory module (DIMM).

Example 25 is the apparatus for computing of example 21, and/or any other example herein, wherein following each field test the means for analyzing is further to generate a prediction of future bit failure percentages as a function of both cumulative memory cycles and time.

Example 26 is the apparatus for computing of example 26, and/or any other example herein, wherein the prediction comprises a continuous function of percentages of bit failures for the time interval beginning with the field test and ending at an end of life of the NVM die.

Example 27 is a method, comprising: performing, in one or more first read/write cycles of a NVM die one or more field tests that provide first indicators of failure associated with one or more first read/write cycles of the NVM die during the use of the NVM die; and comparing the results of the field test with the results of a RT of the NVM die, the results of the RT comprising one or more second indicators of failure associated with one or more second read and write cycles of the NVM die before the NVM die was placed in use. The method further includes predicting and dynamically adjusting, over the one or more first read/write cycles, at least one of likelihood or expected time of failure of the NVM, based at least in part on the first and second indicators of failure.

Example 28 is the method of example 27, and/or any other example herein, further comprising generating a prediction of future bit failure percentages as a function of both memory cycles and time.

Example 29 is the method of example 27, and/or any other example herein, wherein the RT is performed at a time of fabrication of the NVM die, and further comprising storing its results upon being later paired with the NVM die.

Example 30 is the method of example 27, and/or any other example herein, wherein the RT and the one or more field tests each include writing a random string to the NVM, reading it back, and counting the number of bit failures.

Example 31 is the method of example 27, and/or any other example herein, further comprising performing the one or more field tests at a pre-defined frequency set by a manufacturer of the NVM.

Example 32 is the method of example 27, and/or any other example herein, wherein the RT and the one or more field tests each comprise a failure collection test (FCT) that mimics the lifespan of the NVM's expected workload and collects a number of failures at a predefined number of memory cycles within a predefined time unit.

Example 33 is the method of example 32, and/or any other example herein, wherein predicting and dynamically adjusting the likelihood or expected time of failure of the NVM further comprises calculating a delta between the RT FCT and the field test FCT.

What is claimed is:

1. A memory controller (MC), comprising:
   a memory, to store results of a reference performance test (RT) performed on a non-volatile memory (NVM) die at a time of fabrication of the NVM die, wherein the results of the RT comprise one or more first indicators of failure associated with one or more first read and write cycles of the NVM die before the NVM die is placed in use, wherein the RT comprises writing a random string to a set of spatially distributed addresses in the NVM die over a number of memory cycles, to simulate a full life span of the NVM die at the set of the spatially distributed addresses; reading the random string from the set of the spatially distributed addresses; and counting the number of bit failures resulting from the writing and reading of the random string, wherein the results of the RT are provisioned into the memory when the MC is first paired with the NVM die; and
   an analyzer coupled with the memory, to:
   perform, in one or more second read/write cycles, after the NVM die is placed in use, one or more field tests that provide second indicators of failure associated with the one or more second read/write cycles of the NVM die during the use of the NVM die; and
   predict and dynamically adjust, over the one or more second read/write cycles, at least one of likelihood or expected time of failure of the NVM die, based at least in part on the first and second indicators of failure.

2. The MC of claim 1, wherein the memory is to store results of the one or more field tests that comprise the second indicators of failure.

3. The MC of claim 2, wherein the analyzer is to compare the first and second indicators of failure, wherein the prediction is based at least in part on a result of the comparison.

4. The MC of claim 1, wherein the NVM is one of a solid state device (SSD) or a dual in-line memory module (DIMM).

5. The MC of claim 4, wherein the memory controller is integrated in the SSD or DIMM.

6. The MC of claim 1, wherein following each field test, the analyzer is further to generate a prediction of future bit failure percentages as a function of both cumulative memory cycles and time.

7. The MC of claim 6, wherein the prediction comprises a continuous function of percentages of bit failures for a time interval beginning with the field test and ending at an end of life of the NVM die.

8. The MC of claim 1, wherein the analyzer is further to perform the one or more field tests at a pre-defined frequency set by a manufacturer of the NVM, and wherein the results of each field test are stored in the memory so as to overwrite the results of a previous field test.

9. The MC of claim 1, wherein each of the RT and the one or more field tests comprise a failure collection test (FCT) that simulates the life span of the NVM die and collects the number of bit failures at the number of memory cycles within a predefined time unit.

10. One or more non-transitory computer-readable storage media comprising a set of instructions to be executed by a memory controller (MC) comprising a memory and coupled to a non-volatile memory (NVM) die, wherein the memory is to store results of a reference performance test (RT) performed on the NVM die at a time of fabrication of the NVM die, wherein the results of the RT comprise one or more first indicators of failure associated with one or more first read and write cycles of the NVM die before the NVM die is placed in use, wherein the RT comprises writing a random string to a set of spatially distributed addresses in the NVM die over a number of memory cycles, to simulate a full life span of the NVM die at the set of the spatially distributed addresses; reading the random string from the set of the spatially distributed addresses; and counting the number of bit failures resulting from the writing and reading of the random string, wherein the results of the RT are provisioned into the memory when the MC is first paired with the NVM die, wherein the instructions, when executed on the MC, cause the MC to:

perform, in one or more first read/write cycles of the NVM die one or more field tests that provide second indicators of failure associated with one or more first read/write cycles of the NVM die during the use of the NVM die; and compare the results of the field test with the results of the RT of the NVM die; and predict and dynamically adjust, over the one or more first read/write cycles, at least one of likelihood or expected time of failure of the NVM die, based at least in part on the first and second indicators of failure.

11. The one or more non-transitory computer-readable storage media of claim 10, wherein the instructions, when executed, further cause the MC to generate a prediction of future bit failure percentages as a function of both memory cycles and time.

12. The one or more non-transitory computer-readable storage media of claim 10, wherein the instructions, when executed, further cause the MC to perform the one or more field tests at a pre-defined frequency set by a manufacturer of the NVM die.

13. A system, comprising:
a non-volatile memory (NVM) die; and
a memory controller (MC), comprising:
a memory, to store, when the MC is first paired with the NVM die, results of a reference performance test (RT) performed on the NVM die at a time of fabrication of the NVM die, wherein the results of the RT comprise one or more first indicators of failure associated with one or more first read and write cycles of the NVM die before the NVM die is placed in use, wherein the RT comprises writing a random string to a set of spatially distributed addresses in the NVM die over a number of memory cycles, to simulate a full life span of the NVM die at the set of the spatially distributed addresses; reading the random string from the set of the spatially distributed addresses; and counting the number of bit failures resulting from the writing and reading of the random string, wherein the results of the RT are provisioned into the memory when the MC is first paired with the NVM die; and an analyzer coupled with the memory, to:
perform, after the NVM die is placed in use, in one or more second read/write cycles one or more field tests that provide second indicators of failure associated with the one or more second read/write cycles of the NVM die during the use of the NVM die; and predict and dynamically adjust, over the one or more second read/write cycles, at least one of likelihood or expected time of failure of the NVM die, based at least in part on the first and second indicators of failure.

14. The system of claim 13, wherein the NVM die is one of a solid state device (SSD) or a dual in-line memory module (DIMM), and the controller is integrated in the SSD or DIMM.

15. The system of claim 13, wherein the analyzer is to compare the first and second indicators of failure, and wherein the prediction is based at least in part on a result of the comparison.

16. The system of claim 13, wherein the RT and the one or more field tests each comprise a failure collection test (FCT) that simulates the life span of the NVM die and collects the number of bit failures at the number of memory cycles within a predefined time unit.

17. The system of claim 16, wherein to predict and dynamically adjust the likelihood or expected time of failure of the NVM die further includes to calculate a delta between the RT FCT and the field test FCT.

\* \* \* \* \*